(12) United States Patent
Metz et al.

(10) Patent No.: US 6,887,800 B1
(45) Date of Patent: May 3, 2005

(54) METHOD FOR MAKING A SEMICONDUCTOR DEVICE WITH A HIGH-K GATE DIELECTRIC AND METAL LAYERS THAT MEET AT A P/N JUNCTION

(75) Inventors: Matthew V. Metz, Hillsboro, OR (US); Suman Datta, Beaverton, OR (US); Jack Kavalieros, Portland, OR (US); Mark L. Doczy, Beaverton, OR (US); Justin K. Brask, Portland, OR (US); Uday Shah, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/862,169

(22) Filed: Jun. 4, 2004

(51) Int. Cl.[7] .................. H01L 21/31; H01L 21/469
(52) U.S. Cl. .................. 438/778; 438/591; 438/785; 438/216; 438/287
(58) Field of Search .................. 438/216, 287, 438/591, 778, 785

(56) References Cited

U.S. PATENT DOCUMENTS

| | | | |
|---|---|---|---|
| 6,063,698 A | 5/2000 | Tseng et al. ............... 438/585 |
| 6,184,072 B1 | 2/2001 | Kaushik et al. ............ 438/197 |
| 6,255,698 B1 | 7/2001 | Gardner et al. ............ 257/369 |
| 6,365,450 B1 | 4/2002 | Kim ............................ 438/216 |
| 6,410,376 B1 | 6/2002 | Ng et al. .................... 438/199 |
| 6,420,279 B1 | 7/2002 | Ono et al. .................. 438/785 |
| 6,475,874 B2 | 11/2002 | Xiang et al. ............... 438/396 |
| 6,514,828 B2 | 2/2003 | Ahn et al. .................. 438/240 |
| 6,544,906 B2 | 4/2003 | Rotondaro et al. ........ 438/785 |
| 6,586,288 B2 | 7/2003 | Kim et al. .................. 438/183 |
| 6,617,209 B1 | 9/2003 | Chau et al. ................ 438/240 |
| 6,617,210 B1 | 9/2003 | Chau et al. ................ 438/240 |
| 6,620,713 B2 | 9/2003 | Arghavani et al. ........ 438/585 |
| 6,642,131 B2 * | 11/2003 | Harada ....................... 438/591 |
| 6,667,246 B2 * | 12/2003 | Mitsuhashi et al. ........ 438/756 |
| 6,689,675 B1 | 2/2004 | Parker et al. ............... 438/585 |
| 6,696,327 B1 | 2/2004 | Brask et al. ............... 438/197 |
| 6,696,345 B2 | 2/2004 | Chau et al. ................ 438/387 |
| 2002/0058374 A1 | 5/2002 | Kim et al. .................. 438/228 |
| 2002/0197790 A1 | 12/2002 | Kizilyalli et al. .......... 438/240 |
| 2003/0032303 A1 | 2/2003 | Yu et al. .................... 438/770 |
| 2003/0045080 A1 | 3/2003 | Visokay et al. ............ 438/591 |

FOREIGN PATENT DOCUMENTS

EP 0 899 784 AZ 3/1999
GB 2 358 737 A 4/2001

OTHER PUBLICATIONS

Polishchuk et al., "Dual Workfunction CMOS Gate Technology Based on Metal Interdiffusion", www.eesc.berkeley.edu, 1 page.

(Continued)

Primary Examiner—Michael Tran
Assistant Examiner—Renee R. Berry
(74) Attorney, Agent, or Firm—Mark V. Seeley

(57) ABSTRACT

A method for making a semiconductor device is described. That method comprises modifying a first surface, and forming a high-k gate dielectric layer on an unmodified second surface.

6 Claims, 3 Drawing Sheets

OTHER PUBLICATIONS

Doug Barlage et al., "High–Frequency Response of 100nm Integrated CMOS Transistors with High–K Gate Dielectrics", 2001 IEEE, 4 pages.

Lu et al., "Dual–Metal Gate Technology for Deep–Submicron CMOS Devices", dated Apr. 29, 2003, 1 page.

Schwantes et al., "Performance Improvement of Metal Gate CMOS Technologies with Gigabit Feature Sizes", Technical University of Hanburg–Harburg, 5 pages.

U.S. Appl. No. 10/327,293, filed Dec. 20, 2002, Doczy et al., "Integrating N–type and P–type Metal Gate Transistors".

U.S. Appl. No. 10/704,497, filed Nov. 6, 2003, Brask et al., "A Method for Making a Semiconductor Device Having a Metal Gate Electrode".

U.S. Appl. No. 10/704,498, filed Nov. 6, 2003, Brask et al., "A Method for Etching a Thin Metal Layer".

U.S. Appl. No. 10/742,678, filed Dec. 19, 2003, Brask et al., "A Method for Making a Semiconductor Device with a Metal Gate Electrode that is Formed on an Annealed High–K Gate Dielectric Layer".

U.S. Appl. No. 10/739,173, filed Dec. 18, 2003, Brask et al., "A Method for Making a Semiconductor Device that includes a Metal Gate Electrode".

U.S. Appl. No. 10/748,559, filed Dec. 29, 2003, Brask et al., "A CMOS Device With Metal and Silicide Gate Electrodes and a Method for Making It".

U.S. Appl. No. 10/748,545, filed Dec. 29, 2003, Doczy et al., "A Method for Making a Semiconductor Device that Includes a Metal Gate Electrode".

U.S. Appl. No. 10/805,880, filed Mar. 22, 2004, Shah et al., "A Method for Making a Semiconductor Device with a Metal Gate Electrode".

U.S. Appl. No. 10/809,853, filed Mar. 24, 2004, Shah et al., "A Replacement Gte Process for Making a Semiconductor Device that Includes a Metal Gate Electrode".

U.S. Appl. No. 10/898,958, filed Apr. 20, 2004, Brask et al., "A Method for Making a Semiconductor Device Having a High–K Gate Dielectric Layer and a Metal Gate Electrode".

U.S. Appl. No. unknown, filed May 4, 2004, Metz et al., "A Method for Making a Semiconductor Device Having a High–K Gate Dielectric Layer and a Metal Gate Electrode".

U.S. Appl. No. unknown, filed May 26, 2004, Brask et al., "A Method for Making a Semiconductor Device with a High–K Gate Dielecteic and a Conductor that Facilitates Current Flow Across a P/N Junction".

* cited by examiner

US 6,887,800 B1

METHOD FOR MAKING A SEMICONDUCTOR DEVICE WITH A HIGH-K GATE DIELECTRIC AND METAL LAYERS THAT MEET AT A P/N JUNCTION

FIELD OF THE INVENTION

The present invention relates to methods for making semiconductor devices, in particular, semiconductor devices with high-k gate dielectric layers and metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal.

In certain devices, e.g., SRAMs, n-type and p-type metal layers contact each other at a P/N junction. For such devices to function properly, current must flow across that junction. When, however, a replacement gate process is used to form such a device, the dielectric layers upon which the metal layers are deposited may impede current flow between those metal layers. Such a process may impede current flow if those dielectric layers form on the sidewalls of the trenches, which receive the metal layers, in addition to forming on the trench floors. When forming on the trench sidewalls, the dielectric layers may act as an insulator that hinders current flow from one metal layer, which is positioned on one side of the dielectric layers, to another metal layer, which is positioned on the other side of the dielectric layers.

Accordingly, there is a need for a replacement gate process that enables current flow between metal layers that are formed on a high-k gate dielectric layer and that meet at a PIN junction. The method of the present invention provides such a process.

Features shown in these figures are not intended to be drawn to scale.

DETAILED DESCRIPTION OF THE PRESENT INVENTION

A method for making a semiconductor device is described. That method comprises modifying a first surface, and forming a high-k gate dielectric layer on an unmodified second surface. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1k illustrate structures that may be formed when making a semiconductor device using an embodiment of the method of the present invention. In this embodiment, the first surface, which is modified, is a substantially vertical sidewall of a trench. The unmodified second surface, upon which the high-k gate dielectric layer is formed, is a substantially horizontal floor of the trench.

Figure 1A:
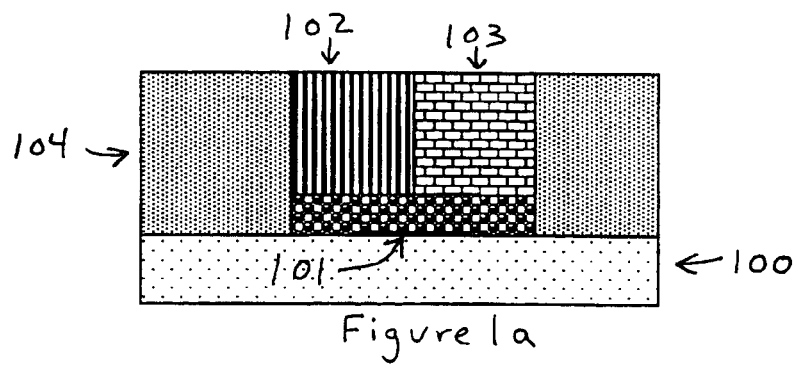
FIGS. 1a–1k represent cross-sections of structures that may be formed when making a semiconductor device using an embodiment of the method of the present invention.

In this embodiment, FIG. 1a represents an intermediate structure that may be created when making a device that will include a P/N junction where first and second metal layers meet. In this embodiment, that structure includes dummy dielectric layer 101, which is formed on substrate 100, and first and second polysilicon layers 102 and 103, which are formed on dummy dielectric layer 101. Dielectric layer 104 borders polysilicon layers 102 and 103.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Dummy dielectric layer 101 may comprise silicon dioxide, or another material that may insulate substrate 100 from other substances. First and second polysilicon layers 102 and 103 preferably are between about 100 and about 2,000 angstroms thick, and more preferably are between about 500 and about 1,600 angstroms thick. Both of those layers may be undoped or doped with similar substances. Alternatively, one layer may be doped, while the other is not doped, or one layer may be doped n-type (e.g., with arsenic, phosphorus or another n-type material), while the other is doped p-type (e.g., with boron or another p-type material). Dielectric layer 104 preferably comprises silicon nitride.

Conventional process steps, materials, and equipment may be used to generate the FIG. 1a structure, as will be apparent to those skilled in the art. Although in this embodiment dummy dielectric layer 101 and polysilicon layers 102 and 103 are formed on substrate 100, other materials may be used in their place—as long as they may be selectively removed to generate structures like those described below.

Figure 1B:
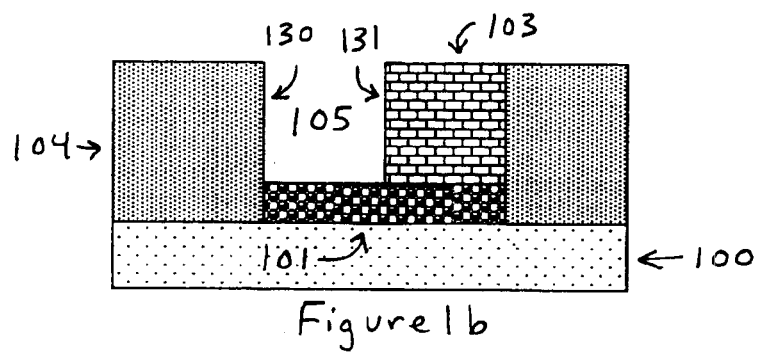

After forming the FIG. 1a structure, first polysilicon layer 102 is removed to generate trench 105, as FIG. 1b illustrates. Trench 105 includes sidewalls 130 and 131. In a preferred embodiment, a wet etch process that is selective for layer 102 over second polysilicon layer 103 is applied to remove layer 102 without removing significant portions of layer 103. If first polysilicon layer 102 is doped n-type, and second polysilicon layer 103 is doped p-type (e.g., with boron), such a wet etch process may comprise exposing first polysilicon layer 102 to an aqueous solution that comprises a source of hydroxide for a sufficient time at a sufficient temperature to remove substantially all of layer 102. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

First polysilicon layer 102 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, a polysilicon layer with a thickness of about 1,350 angstroms may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of an n-type polysilicon layer without removing a meaningful amount of a p-type polysilicon layer.

As an alternative, first polysilicon layer 102 may be selectively removed by exposing it for at least one minute to a solution, which is maintained at a temperature between about 60° C. and about 90° C., that comprises between about 20 and about 30 percent TMAH by volume in deionized water, while applying sonic energy. Removing a polysilicon layer with a thickness of about 1,350 angstroms by exposing it at about 80° C. for about 2 minutes to a solution that comprises about 25 percent TMAH by volume in deionized water (while applying sonic energy at about 1,000 KHz, dissipating at about 5 watts/cm$^2$) may remove substantially all of that layer without removing a significant amount of layer 103. Dummy dielectric layer 101 should be sufficiently thick to prevent the etchant that is applied to remove first polysilicon layer 102 from reaching the underlying substrate.

Figure 1C:
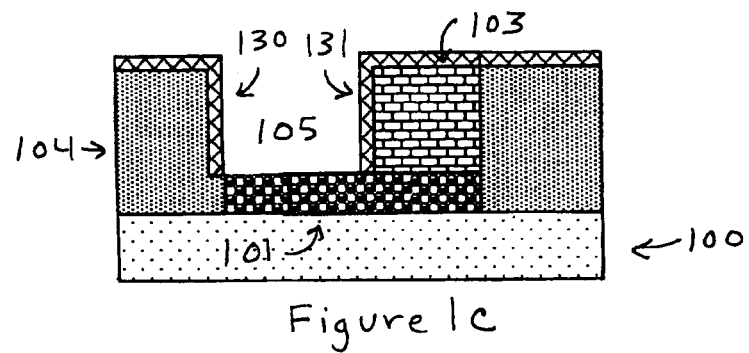

After removing first polysilicon layer 102, at least part of sidewalls 130 and 131 of trench 105 are modified to inhibit formation of a high-k dielectric layer on their surfaces—as FIG. 1c illustrates. In a preferred embodiment, sidewalls 130 and 131 are modified by exposing them to fluorine and/or hydrogen. A deposition process that employs a dry etch chemistry may be applied to deliver fluorine to the sidewalls. Such a dry etch chemistry may comprise SF$_6$ or a conventionally used fluorocarbon. A deposition process that employs a wet etch chemistry may be applied to deliver hydrogen to the sidewalls. Such a wet etch chemistry may comprise hydrogen fluoride.

Whether a dry etch or wet etch chemistry is used to modify sidewalls 130 and 131, a sufficient amount of the active component should be used to ensure that a meaningfully thick high-k dielectric layer will not grow on those sidewalls. In a preferred embodiment, sidewalls 130 and 131 are exposed to a plasma that is derived from a fluorine based compound until substantial portions of those sidewalls become fluorine terminated. Such fluorine terminated surfaces may prevent, or at least significantly reduce, high-k dielectric growth on the sidewalls.

Figure 1D:
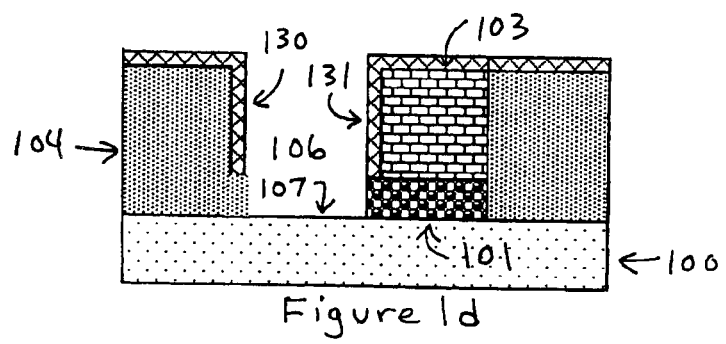

After modifying substantially vertical sidewalls 130 and 131, as described above, the exposed part of dummy dielectric layer 101 is removed to generate trench 106, as shown in FIG. 1d. Trench 106 includes substantially horizontal floor 107 in addition to substantially vertical sidewalls 130 and 131. If dummy dielectric layer 101 comprises silicon dioxide, it may be removed using an etch process that is selective for silicon dioxide. Such an etch process may comprise exposing layer 101 to a solution that includes about 1 percent HF in deionized water for a sufficient time to remove substantially all of the exposed part of dummy dielectric layer 101.

Figure 1E:
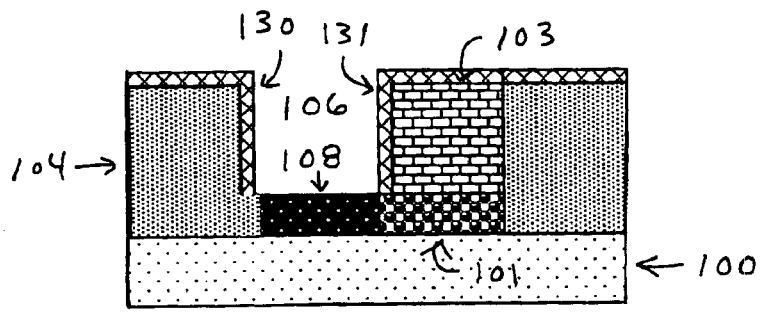

After removing the exposed part of dummy dielectric layer 101, first high-k gate dielectric layer 108 is formed on substrate 100 within trench 106, generating the FIG. 1e structure. Some of the materials that may be used to make first high-k gate dielectric layer 108 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form first high-k gate dielectric layer 108 are described here, that layer may be made from other materials.

In this embodiment, first high-k gate dielectric layer 108 may be formed within trench 106 using a conventional atomic layer chemical vapor deposition ("ALCVD") process. In such a process, a metal oxide precursor (e.g., a metal chloride) and steam may be fed at selected flow rates into an ALCVD reactor, which is then operated at a selected temperature and pressure to generate an atomically smooth interface between substrate 100 and first high-k gate dielectric layer 108. The ALCVD reactor should be operated long enough to form a layer with the desired thickness. In most applications, first high-k gate dielectric layer 108 should be less than about 60 angstroms thick, and more preferably between about 5 angstroms and about 40 angstroms thick.

Because sidewalls 130 and 131 have been modified previously (e.g., by exposing them to fluorine and/or hydrogen), a meaningful amount of a high-k dielectric layer will not grow on those sidewalls when first high-k gate dielectric layer 108 is formed on floor 107 of trench 106— even if an ALCVD process is used to form layer 108. In the illustrated embodiment, first metal layer 109 is formed directly on layer 108 to fill trench 106. First metal layer 109 may comprise an n-type metal. Materials that may be used to form n-type metal layer 109 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide.

Figure 1F:
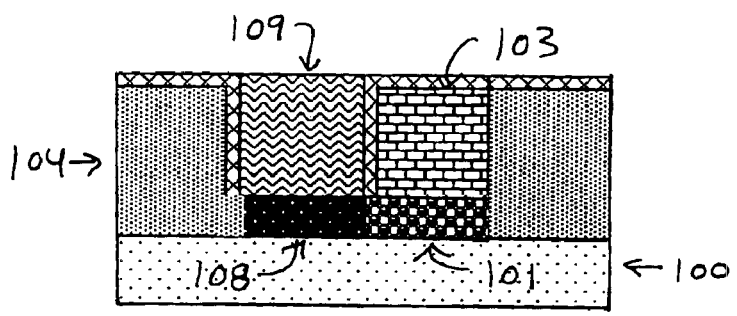

N-type metal layer 109 may be formed on first high-k gate dielectric layer 108 using well known physical vapor deposition ("PVD") or chemical vapor deposition ("CVD") processes, e.g., conventional sputter or atomic layer CVD processes. Although an n-type metal layer may be initially deposited over the entire device, FIG. 1f illustrates the structure that results after n-type metal layer 109 has been removed except where it fills trench 106. Layer 109 may be removed from other portions of the device using an appropriate chemical mechanical polishing ("CMP") operation.

N-type metal layer 109 preferably has a workfunction that is between about 3.9 eV and about 4.2 eV, preferably is between about 100 angstroms and about 2,000 angstroms thick, and more preferably is between about 500 angstroms and about 1,600 angstroms thick. Although FIG. 1f represents a structure in which n-type metal layer 109 completely fills trench 106, in alternative embodiments, n-type metal layer 109 may fill only part of trench 106, with the remainder of the trench being filled with a material that may be easily polished, e.g., tungsten, aluminum, titanium, or titanium nitride. In such an alternative embodiment, n-type metal layer 109 preferably is between about 25 and about 300 angstroms thick.

Figure 1G:
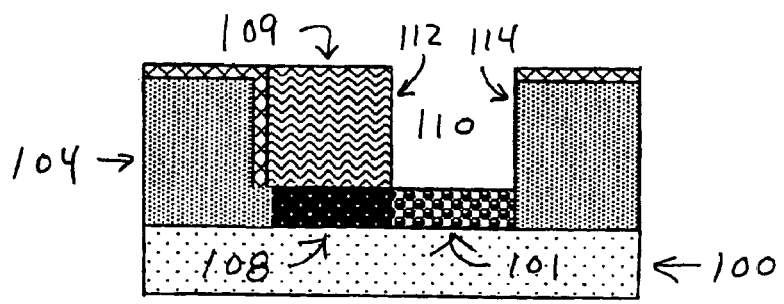

In the illustrated embodiment, after forming n-type metal layer 109 within trench 106, second polysilicon layer 103 is removed to generate trench 110, as FIG. 1g illustrates. If first polysilicon layer 102 is n-type, then second polysilicon layer 103 preferably is p-type. In a preferred embodiment, p-type layer 103 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 103 without removing significant portions of n-type metal layer 109.

Figure 1H:
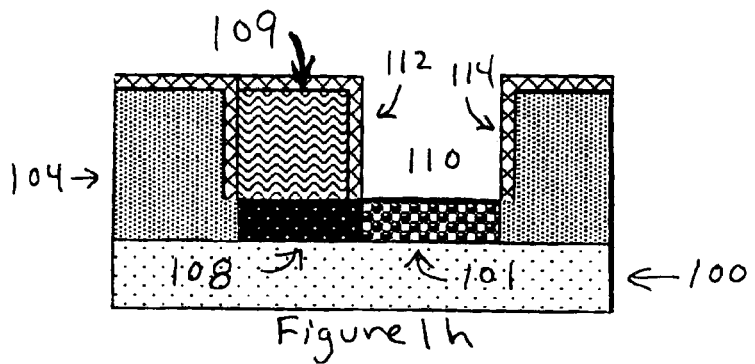
Figure 1I:
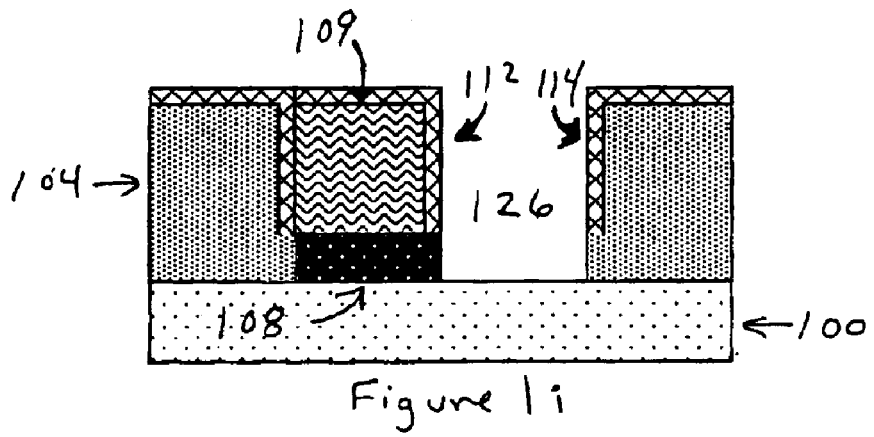

After removing second polysilicon layer 103, at least part of sidewalls 112 and 114 of trench 110 are modified to inhibit formation of a high-k dielectric layer on their surfaces—as shown in FIG. 1h. Sidewalls 112 and 114 maybe modified using processes and materials like those that may be used to modify sidewalls 130 and 131, as described above. After modifying substantially vertical sidewalls 112 and 114, the exposed part of dummy dielectric layer 101 is removed to generate trench 126, as shown in FIG. 1i. The same process that was used to remove part of dummy dielectric layer 101, after modifying sidewalls 130 and 131, may be used.

Figure 1J:
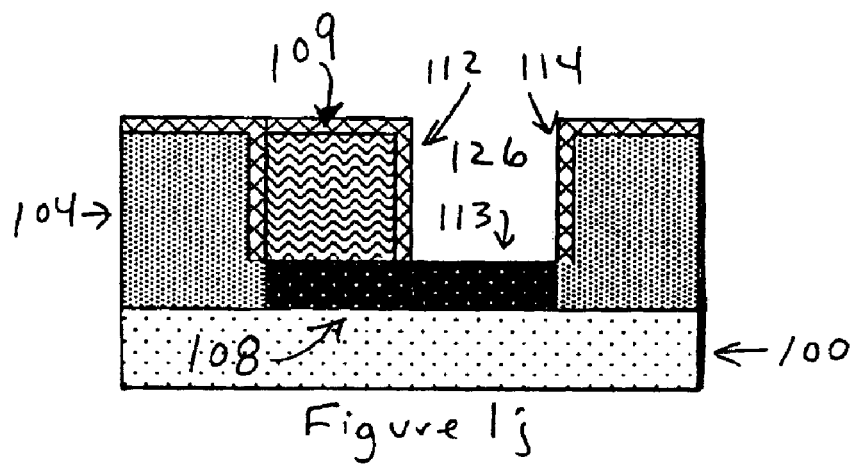

Second high-k gate dielectric layer 113 is then formed within trench 126 to generate the FIG. 1j structure. Because sidewalls 112 and 114 have been modified previously, a meaningful amount of a high-k dielectric layer will not form on sidewalls 112 and 114—even if a conventional ALCVD process is used to form second high-k gate dielectric layer 113. In this embodiment, after replacing layer 101 with layer 113, second metal layer 115 is formed directly on layer 113 to fill trench 126 and to generate the FIG. 1k structure. Second metal layer 115 may comprise a p-type metal. Materials that may be used to form p-type metal layer 115 include: ruthenium, palladium, platinum, cobalt, nickel, and conductive metal oxides, e.g., ruthenium oxide.

Figure 1K:
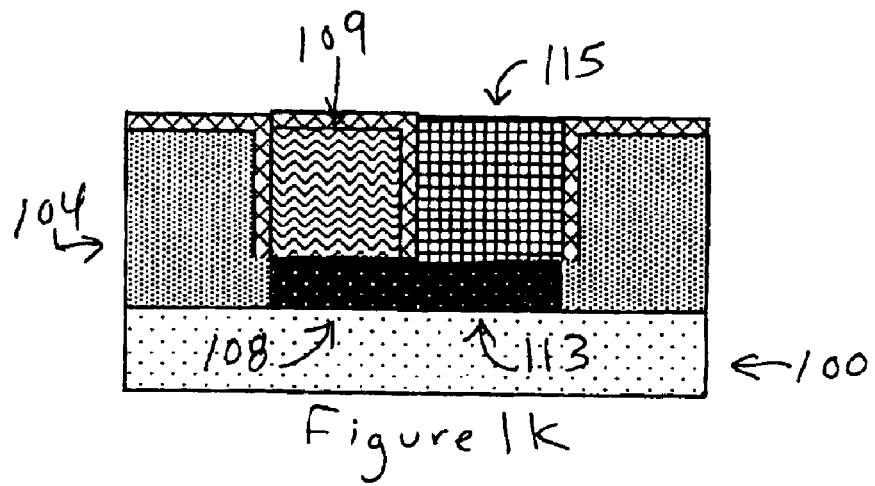

P-type metal layer 115 may be formed on second high-k gate dielectric layer 113 using well known PVD or CVD processes. As shown in FIG. 1k, p-type metal layer 115 has been removed, e.g., by applying an appropriate CMP operation, except where it fills trench 126. P-type metal layer 115 may have a workfunction that is between about 4.9 eV and about 5.2 eV, and may be between about 100 angstroms and about 2,000 angstroms thick. Like n-type metal layer 109, in this embodiment p-type metal layer 115 preferably is between about 500 angstroms and about 1,600 angstroms thick.

Although FIG. 1k represents a structure in which p-type metal layer 115 completely fills trench 126, in alternative embodiments, p-type metal layer 115 may fill only part of that trench. As with n-type metal layer 109, the remainder of trench 126 may be filled with a material that may be easily polished, e.g., tungsten, aluminum, titanium, or titanium nitride. In such an alternative embodiment, p-type metal layer 115 preferably is between about 25 and about 300 angstroms thick. Although this embodiment illustrates forming an n-type metal layer prior to forming a p-type metal layer, alternative embodiments may form a p-type metal layer prior to forming an n-type metal layer.

Because sidewalls 112, 114, 130, and 131 were modified to inhibit meaningful growth of a high-k dielectric layer on their surfaces, process steps for forming first and second high-k gate dielectric layers 108 and 113 will not create a dielectric barrier that may impede current flow between first metal layer 109 and second metal layer 115. The method of the present invention thus ensures adequate current flow—across a P/N junction where first metal layer 109 and second metal layer 115 meet—even when a conventional ALCVD process is used to form first and second high-k gate dielectric layers 108 and 113.

The method described above may enable a replacement gate process to be used to form a device (e.g., an SRAM) that requires n-type and p-type metal layers to contact each other at a P/N junction. Although the embodiments described above provide examples of processes for forming such a device, the present invention is not limited to these particular embodiments.

The method of the present invention may be applied in other contexts. For example, this method may be applied to replacement gate processes for making other types of devices, e.g., CMOS devices in which n-type and p-type metal gate electrodes are separated by a dielectric layer. Alternatively, this method may be applied to other types of processes for forming metal gate electrodes on high-k gate dielectric layers—e.g., subtractive processes in which a metal layer is deposited on a high-k dielectric layer, followed by etching those layers to define a metal gate electrode and a high-k gate dielectric layer. In this respect, the present invention contemplates any process that makes a semiconductor device by modifying a first surface, and forming a high-k gate dielectric layer on an unmodified second surface.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a dielectric layer on a substrate;

forming a trench within the dielectric layer, the trench having a sidewall;

exposing at least part of the sidewall to fluorine to inhibit formation of a high-k dielectric layer on the surface of the sidewall; and forming a high-k gate dielectric layer within the trench without forming a meaningful amount of a high-k dielectric layer on the surface of the sidewall.

2. The method of claim 1, wherein a deposition process that employs a dry etch chemistry is used to deliver fluorine to the sidewall.

3. The method of claim 2 wherein the dry etch chemistry comprises $SF_8$ or a fluorocarbon.

4. A method for making a semiconductor device comprising:

forming a dielectric layer on a substrate;

forming a first trench within the dielectric layer, the first trench having a first sidewall;

modifying at least part of the first sidewall;

forming a first high-k gate dielectric layer within the first trench;

forming a first metal layer on the first high-k gate dielectric layer;

forming a second trench within the dielectric layer, the second trench having a second sidewall;

modifying at least part of the second sidewall;

forming a second high-k gate dielectric layer within the second trench; and forming a second metal layer on the second high-k ate dielectric layer;

wherein the first metal layer and the second metal layer meet at a P/N junction.

5. The method of claim 4 further comprising:

removing a first polysilicon containing layer to form the first trench;

removing a first part of a dummy dielectric layer after modifying the first sidewall and before forming the first high-k gate dielectric layer within the first trench;

removing a second polysilicon containing layer to form the second trench; and removing a second part of the dummy dielectric layer after modifying the second sidewall and before forming the second high-k gate dielectric layer within the second trench.

6. The method of claim 4 wherein at least part of the first sidewall is modified by exposing it to fluorine, and wherein at least part of the second sidewall is modified by exposing it to fluorine.

\* \* \* \* \*

UNITED STATES PATENT AND TRADEMARK OFFICE
CERTIFICATE OF CORRECTION

PATENT NO.    : 6,887,800 B1
DATED         : May 3, 2005
INVENTOR(S)   : Metz et al.

It is certified that error appears in the above-identified patent and that said Letters Patent is hereby corrected as shown below:

Column 6,
Line 48, delete "$SF_8$" and insert -- $SF_6$ --.
Line 66, delete "ate" and insert -- gate --.

Signed and Sealed this

Twelfth Day of July, 2005

JON W. DUDAS
*Director of the United States Patent and Trademark Office*